US012723955B2

(12) United States Patent
Fitzcharles et al.

(10) Patent No.: US 12,723,955 B2
(45) Date of Patent: Sep. 1, 2026

(54) IN SITU BIASING AND FREEZING OF CYROGENIC ELECTRON MICROSCOPY SAMPLES

(71) Applicant: Alliance for Energy Innovation, LLC, Golden, CO (US)

(72) Inventors: Nikita Susan Dutta Fitzcharles, Denver, CO (US); Rory Patrick Andrykowski, Sedalia, CO (US); Steven Scott Robbins, Arvada, CO (US); Katherine Leigh Jungjohann, Littleton, CO (US)

(73) Assignee: Alliance for Energy Innovation, LLC, Golden, CO (US)

( * ) Notice: Subject to any disclaimer, the term of this patent is extended or adjusted under 35 U.S.C. 154(b) by 428 days.

(21) Appl. No.: 18/452,782

(22) Filed: Aug. 21, 2023

(65) Prior Publication Data

US 2024/0060864 A1 Feb. 22, 2024

Related U.S. Application Data

(60) Provisional application No. 63/371,907, filed on Aug. 19, 2022.

(51) Int. Cl.
*G01N 1/42* (2006.01)
*B01L 3/00* (2006.01)
(Continued)

(52) U.S. Cl.
CPC ................ *G01N 1/42* (2013.01); *B01L 3/508* (2013.01); *G01N 27/4161* (2013.01);
(Continued)

(58) Field of Classification Search
CPC ...... G01N 1/42; G01N 27/4161; B01L 3/508; B01L 2300/0832; B01L 2300/185;
(Continued)

(56) References Cited

U.S. PATENT DOCUMENTS 6,027,075 A * 2/2000 Petrenko .................. H02G 7/16 219/770
8,256,232 B2 * 9/2012 Burg ........................ G01N 1/42 62/66
(Continued)

FOREIGN PATENT DOCUMENTS

CN 105163579 B * 1/2018 ............. A01N 1/147
DE 112010000799 T5 * 11/2012 .............. H01J 37/08
(Continued)

OTHER PUBLICATIONS

Electron Microscopy, "Electron microscopes reveal hidden wonders that are smaller than the human eye can see," ThermoFisher Scientific, https://www.fei.com/vitrobot/#gsc.tab=0, accessed Nov. 14, 2023, 2 pages.
(Continued)

*Primary Examiner* — David A Vanore
(74) *Attorney, Agent, or Firm* — Neal S. Vickery

(57) ABSTRACT

Described herein are devices and methods for flash freezing samples while applying an in situ electrical current or bias. Advantageously, the present application is directed towards materials, such as batteries or electrochemical cells, where applying an electrical current or bias leads to dynamic changes to the structure and chemistry of constituent materials, which underpin device performance and degradation. By concurrently applying electrical current or bias and flash freezing the sample, transient structures in the anode, cathode, or electrolyte can be observed with a high degree of temporal resolution at an atomic scale.

15 Claims, 7 Drawing Sheets

(51) Int. Cl.
*G01N 27/416* (2006.01)
*H01J 37/20* (2006.01)
*H01J 37/26* (2006.01)

(52) U.S. Cl.
CPC ............ *H01J 37/20* (2013.01); *H01J 37/263* (2013.01); *B01L 2300/0832* (2013.01); *H01J 2237/2001* (2013.01); *H01J 2237/2007* (2013.01)

(58) Field of Classification Search
CPC .... B01L 2300/1894; B01L 7/525; B01L 9/52; H01J 37/20; H01J 37/263; H01J 2237/2001; H01J 2237/2007
See application file for complete search history.

(56) References Cited

U.S. PATENT DOCUMENTS

| | | | | |
|---|---|---|---|---|
| 2011/0027876 A1* | 2/2011 | Lihl | G01N 1/42 435/307.1 |
| 2012/0060541 A1* | 3/2012 | Hunt | G01N 35/04 312/107 |
| 2012/0220046 A1* | 8/2012 | Chao | H01J 37/317 422/186.04 |
| 2013/0263622 A1* | 10/2013 | Mullen | B01L 7/04 435/307.1 |
| 2024/0060864 A1* | 2/2024 | Fitzcharles | H01J 37/20 |

FOREIGN PATENT DOCUMENTS

| | | | |
|---|---|---|---|
| DE | 102018100844 A1 * | 7/2019 | A01N 1/125 |
| WO | WO-2005026684 A2 * | 3/2005 | B81B 1/008 |

OTHER PUBLICATIONS

Huang, W. et al., "Dynamic Structure and Chemistry of the Silicon Solid-Electrolyte Interphase Visualized by Cryogenic Electron Microscopy," CellPress, Matter, vol. 1, Nov. 6, 2019, 36 pages.

Leica EM ICE High Pressure Freezer, "High pressure freezing with the possibility of light and electrical stimulation," https://www.leica-microsystems.com/products/sample-preparation-for-electron-microscopy/p/leica-em-ice/, accessed Nov. 7, 2023; 10 pages.

Li, Y. et al., "Atomic structure of sensitive battery materials and interfaces revealed by cryo-electron microscopy," Science, vol. 358, Oct. 27, 2017, 6 pages.

Li, Y. et al., "Opportunities for Cryogenic Electron Microscopy in Materials Science and Nanoscience," ACS Nano, vol. 14, 2020, 14 pages.

Lin, F. et al., "Chemical and Structural Stability of Lithium-Ion Battery Electrode Materials under Electron Beam," Scientific Reports, vol. 4:5694, Jul. 16, 2014, 6 pages.

Singh, N. et al., "Role of Lithium lodide Addition to Lithium Thiophosphate: Implications beyond Conductivity," ACS Chemistry of Materials, vol. 32, 2020, 9 pages.

Wang, X. et al., "New Insights on the Structure of Electrochemically Deposited Lithium Metal and Its Solid Electrolyte Interphases via Cryogenic TEM," Acs Nano Letters, vol. 17, 2017, 7 pages.

Zachman, M.J. et al., "Cryo-STEM mapping of solid-liquid interfaces and dendrites in lithium-metal batteries," Nature Letter, vol. 560, Aug. 16, 2018, 17 pages.

Zhang, Z. et al., "Capturing the swelling of solid-electrolyte interphase in lithium metal batteries," Science, vol. 375, 2022, 6 pages.

* cited by examiner

Cold sample removal

Cell in in-situ holder $LN_2$

1. Plunge freeze cell

IN SITU BIASING AND FREEZING OF CYROGENIC ELECTRON MICROSCOPY SAMPLES

CROSS-REFERENCE TO RELATED APPLICATIONS

This application claims priority from U.S. Provisional Patent Application No. 63/371,907, filed on Aug. 19, 2022, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Recent advances in cryogenic transmission electron microscopy (cryo-TEM) have led to advanced imaging of biological samples, including the awarding of a Nobel prize for the technology in 2017. This method commonly utilizes plunge freezers to flash freeze suspensions of biological particles onto TEM grids, which are then imaged in the TEM while frozen. The cryogenic temperatures stabilize these samples, which would normally be quickly damaged by electron beam irradiation during characterization. Recently, cryo-TEM has also been used to preserve the structure of beam-sensitive device materials, particularly lithium-ion battery materials, so that they can be characterized at high spatial resolutions not possible with traditional, room temperature microscopy. However, there are no commercial sample preparation tools designed specifically for electronic device materials. With batteries and many other devices, it is essential to be able to characterize the structure of constituent materials under the electrical bias or current flow that occurs during device operation. For batteries, this requires flash freezing the device in situ during electrochemical tests to freeze the transient material structures that arise under bias or current so they can then be characterized at high spatial resolutions with cryo-TEM. The present application adds electrical biasing capabilities into a plunge freezer. Notably, this ability to freeze dynamic material structures for in-depth study will be useful even for device materials that are less sensitive to electron beam-induced damage.

While current techniques for preparing cryo-TEM samples from device materials exist, they rely on ex-situ processes, for instance in which a battery is removed from electrical current or bias, disassembled under inert atmosphere, thinned for electron transparency (e.g., by mechanically scraping off small pieces of the constituent material of interest or cross-sectioning it via focused ion beam), and finally characterized with cryo-TEM. These methods require a significant amount of time between the application of current or bias during device testing and the characterization of the sample via cryo-TEM, which prevents the study of dynamic structures that evolve during device testing with high temporal resolution.

SUMMARY

Described herein are devices and methods for flash freezing samples while applying an in situ electrical current or bias. Advantageously, the present application is directed towards materials, such as batteries or electrochemical cells, where applying an electrical current or bias leads to dynamic changes to the structure and chemistry of constituent materials, which underpin device performance and degradation. By concurrently applying electrical current or bias and flash freezing the sample, transient structures in the anode, cathode, or electrolyte can be observed with a high degree of temporal resolution at an atomic scale.

While the devices and methods described herein are useful for preparing cryo-TEM samples from electrochemical cells as described herein, they may also be utilized in any situation in which electrical current or bias alters the physical or chemical structure of the sample. Further, these devices and methods may be useful even in situations where the device or sample is not sensitive to electron beam-induced damage, for instance to kinetically suspend a transient structure that would otherwise evolve too fast for high spatial resolution TEM characterization.

In an aspect, provided is a method for preparing a sample for cryo-TEM comprising: a) providing a sample, b) applying an electrical current or bias to the sample, and c) flash freezing the sample while electrical current or bias is still being applied. In some embodiments, the method may further comprise thinning and characterizing the sample via cryogenic transmission electron microscopy (cryo-TEM) after the sample has been frozen.

The sample may comprise an electrochemical cell or a battery, for example, a modified coin cell comprising a pre-thinned TEM grid as an electrode.

The step of flash freezing may be performed by submerging the sample in a cryogenic liquid (e.g., liquid nitrogen or liquid ethane). This step may be accomplished by utilizing an automated plunge freezer. For reference, plunge freezers that are currently incapable of applying an electrical bias are available commercially, including the Vitrobot® from ThermoFisher Scientific® and the Leica® Em GP2.

In another aspect, provided is a device for preparing a sample for cryo-TEM comprising: a) a sample holder capable of applying an electrical bias or current to a sample; b) a reservoir for storing a cryogenic liquid; and c) an actuator for moving the sample holder from a first position, wherein the sample holder is spatially positioned outside of the reservoir to a second position, wherein the sample holder is spatially positioned inside the reservoir.

An example of a sample holder would be a pair of tweezers or tongs made from an insulating material, to prevent shorting of the sample, with attached tips made of a conductive material, such as metal, that connect to a current or voltage source and form an electrical circuit with the sample when closed. The device may further comprise a source of electrical current or bias such as a potentiostat, galvanostat, or other electrochemical workstation, a battery, or a wall outlet that is in electrical communication with a power grid.

The reservoir may contain a cryogenic material or liquid, including for example, liquid or slush nitrogen, liquid ethane, liquid oxygen, and the like. For safety reasons, inert cryogens such as liquid or slush nitrogen may be preferable.

In order to rapidly freeze the sample and maintain the desired temporal resolution, the actuator may be capable of moving the sample from the first position outside of the cryogenic liquid to the second position within the cryogenic liquid in a time less than or equal to 5 s, 2 s, 1 s, 0.5 s or 0.1 s.

The sample holder may be specifically designed to hold a sample that has been modified of manufactured to either contain a pre-thinned TEM grid working electrodes specimen or be suitable for thinning post-freezing via cryo-focused ion beam. One example would be a modified coin cell battery, although other device geometries, including non-planar or flat devices, could also be analyzed.

BRIEF DESCRIPTION OF DRAWINGS

Some embodiments are illustrated in referenced figures of the drawings. It is intended that the embodiments and figures disclosed herein are to be considered illustrative rather than limiting.

FIG. 1 provides an exemplary schematic of a plunge freezer device as described herein, where the sample holder is open (containing no sample) and outside of the cryogenic liquid.

REFERENCE NUMERALS

Figure 2:
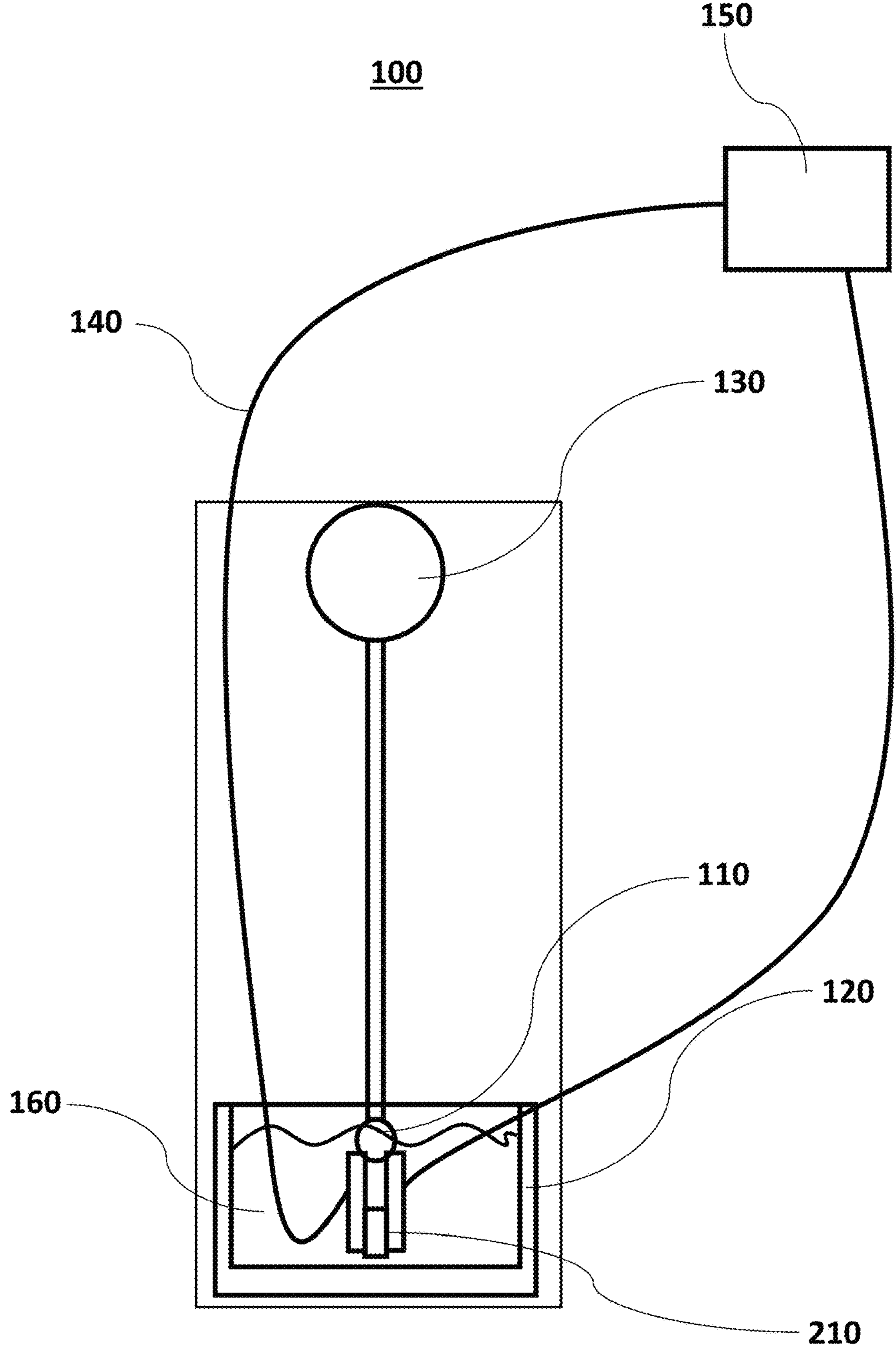
FIG. 2 provides an exemplary schematic of a plunge freezer device as described herein, wherein the sample holder holds a sample and is submerged in the cryogenic liquid.
Figure 3:
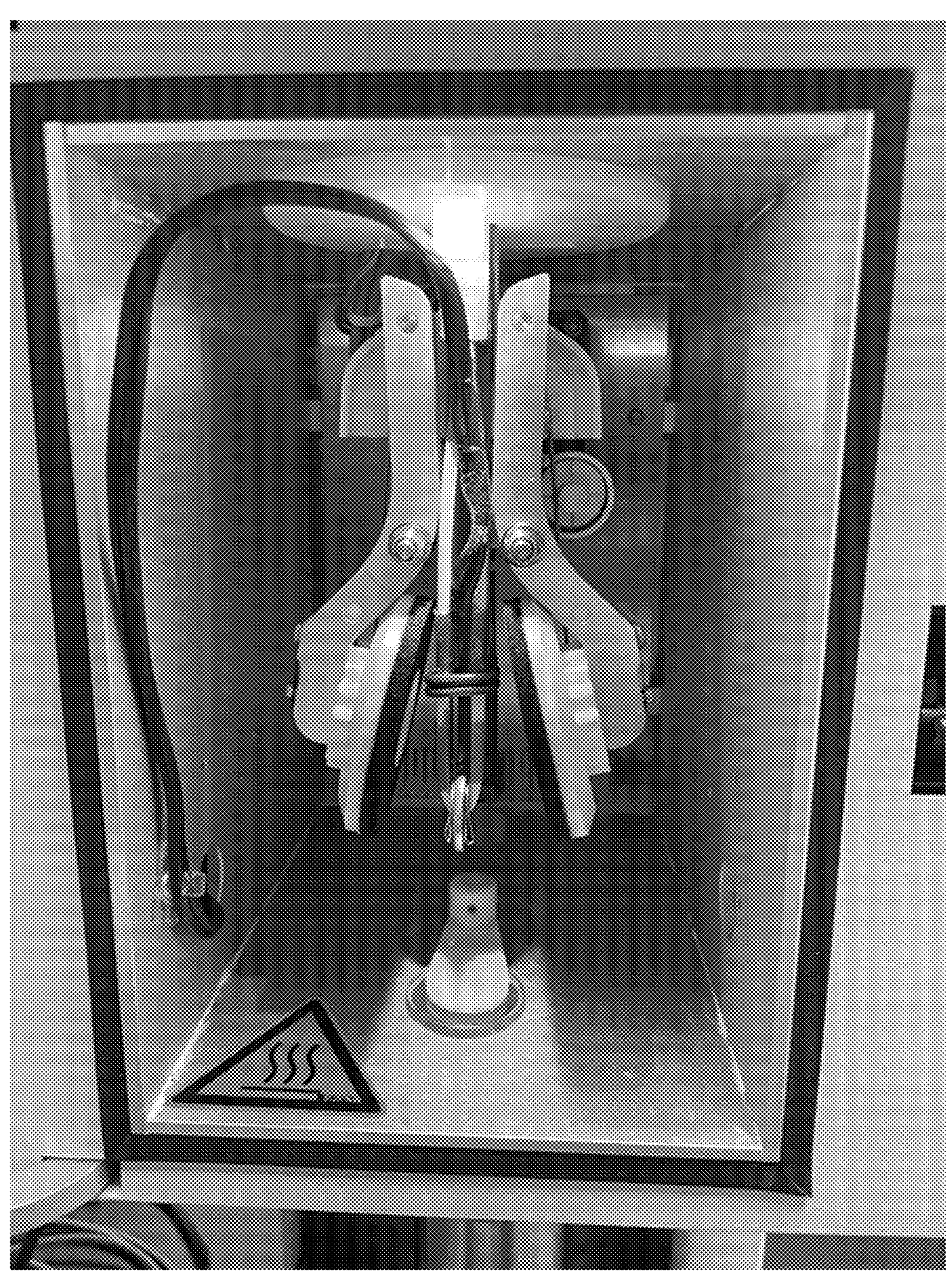
FIG. 3 is a photograph of an exemplary device sample holder with electrical connections attached.

100 Example plunge freezing device
110 Sample holder
120 Cryogenic reservoir
130 Actuator
140 Electrical conduit (e.g., wires)
150 Source of electrical current or bias, power source
160 Cryogenic liquid

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present application is directed towards a device for the in situ cryogenic freezing of a sample that is concurrently being subjected to the application of an electric current or bias, which can be referred to as a modified plunge freezer.

Figure 1:
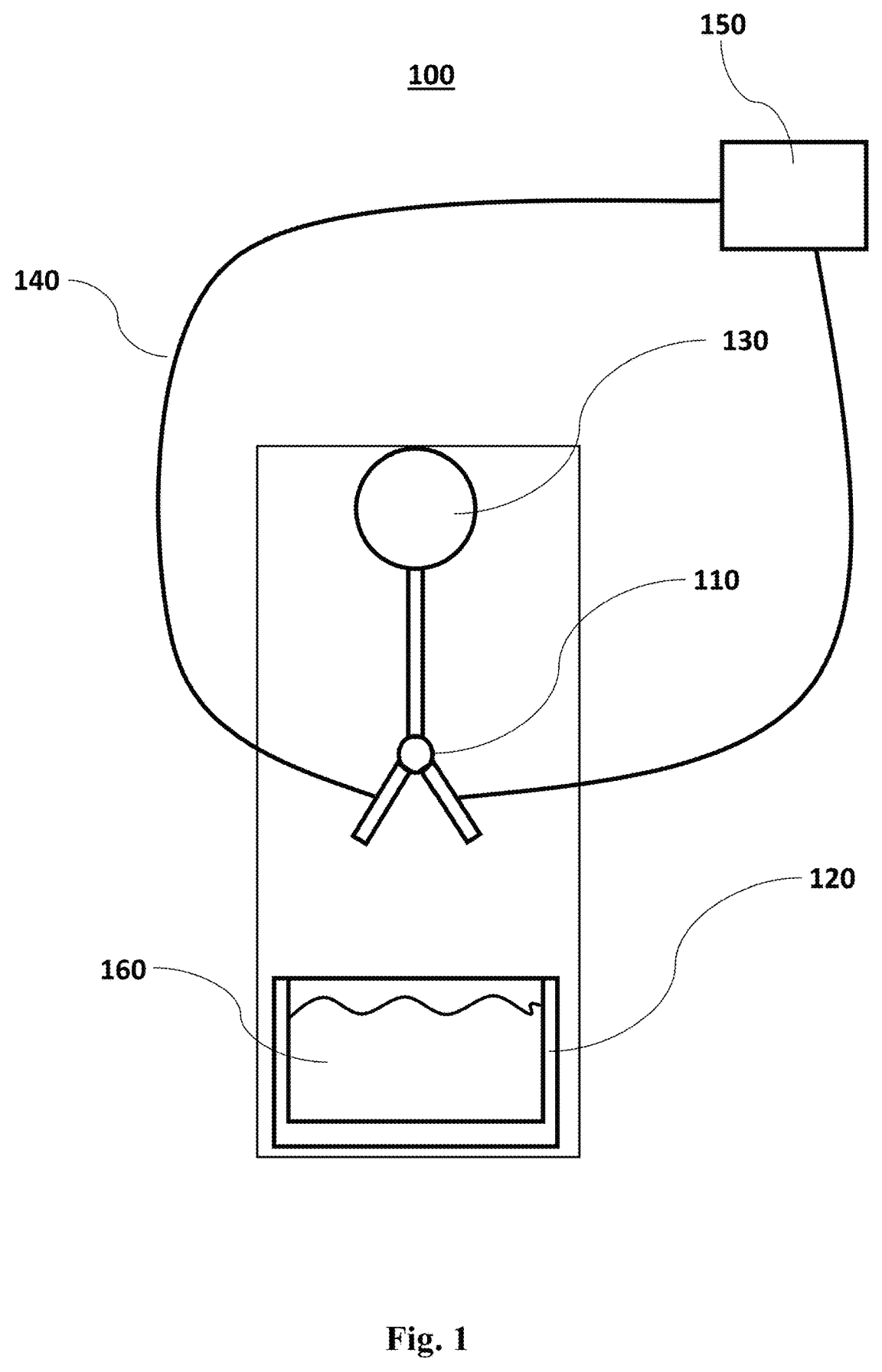

An example of the present invention is shown in FIGS. 1-2. FIG. 1 shows a plunge freezer 100 prior to sample loading, wherein the sample holder 110 is open and positioned outside of the cryogenic reservoir 120. The sample holder 110 is physically attached to an actuator 130 and is in electrical communication with a current, voltage, or power source 150 via two electrical conduits or wires 140 attached to conductive tips on the prongs or tweezers of the sample holder 110 and capable of forming an electrical circuit when the sample holder 110 is closed. The cryogenic reservoir 120 contains a cryogenic liquid 160, such as liquid nitrogen.

FIG. 2 illustrates the plunge freezer 100 with a sample 210 present and held by the sample holder 110. The actuator 130 has been activated and the sample 210 is moved into the cryogenic liquid 160 within the cryogenic reservoir 120. The source of electrical current or bias 150 and attached electrical conduits 140 can subject the sample 210 to an electrical current or bias via the sample holder 110 either to the point directly before the actuator 130 is activated and the sample 210 is moved into the cryogenic liquid 160, or alternatively, can maintain the electrical current or bias throughout the submersion process.

Figure 4:
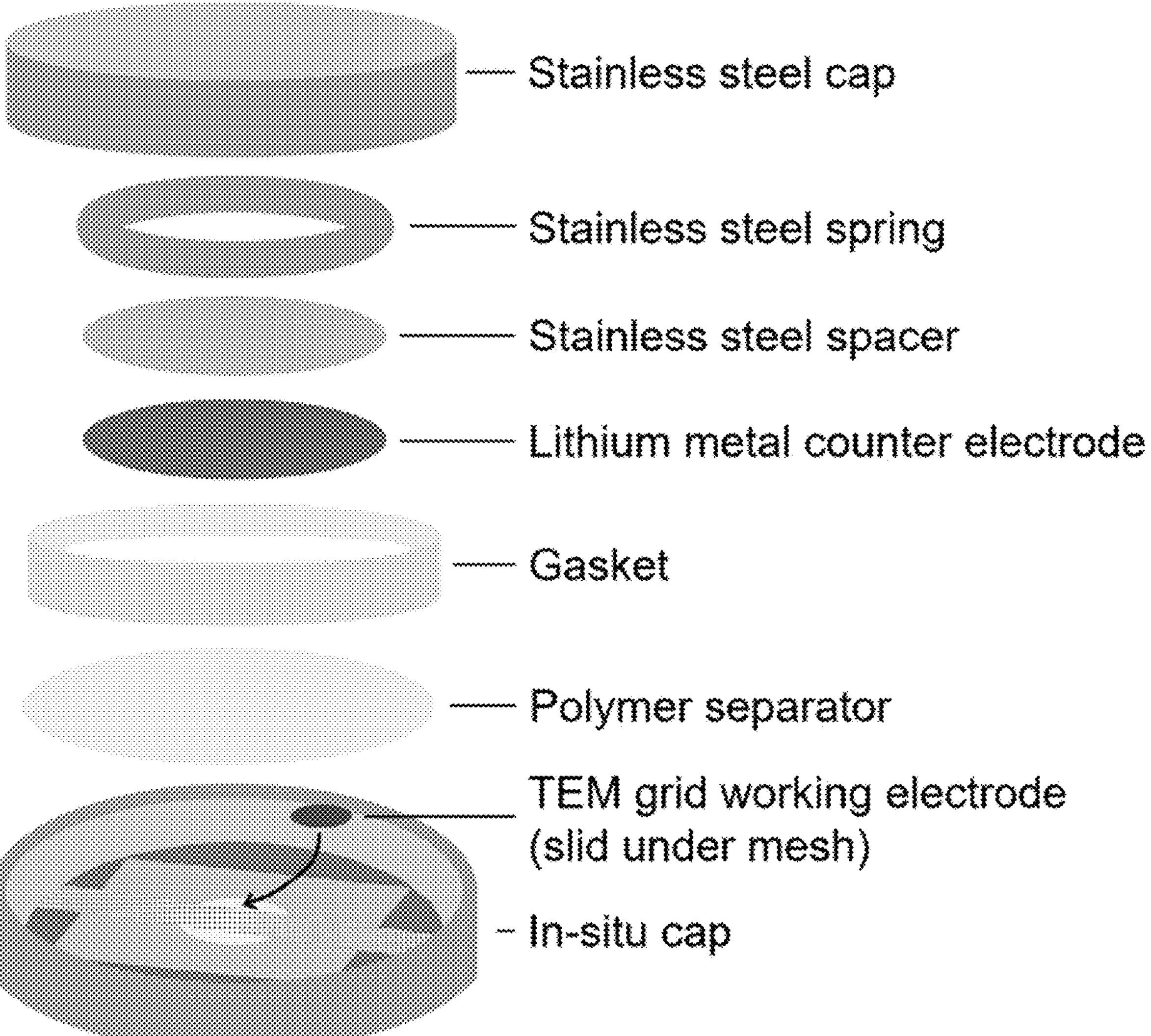
FIG. 4 illustrates the composition of an example sample, in this case a coin cell modified to include a TEM grid acting as a working electrode.
Figure 5:
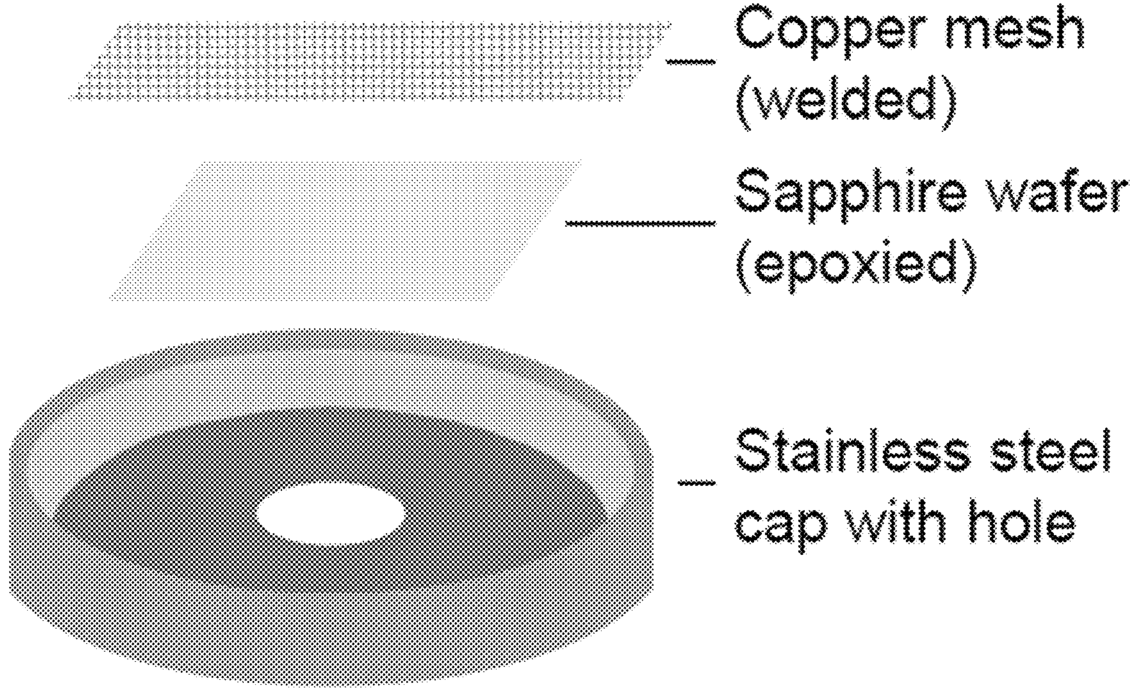
FIG. 5 provides detail of TEM grid working electrode modifications to the coin cell casing to enable removal of the TEM grid while under the cryogen for subsequent cryo-TEM characterization.
Figure 6:
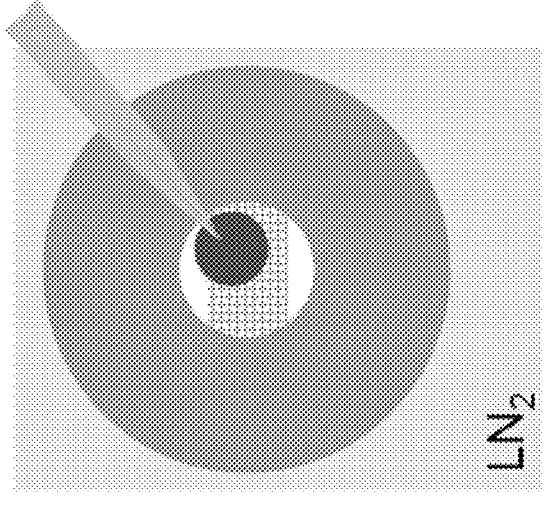
FIG. 6 provides an example process for the removal of the TEM grid working electrode from the sample after the in situ freezing during application of electrical current or bias has taken place.
Figure 6:
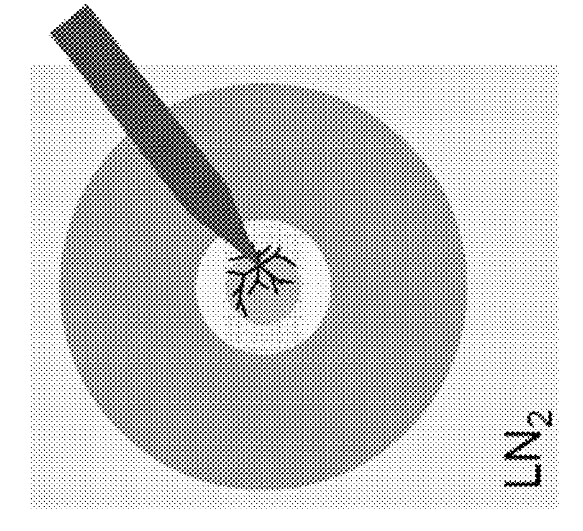
Figure 7:
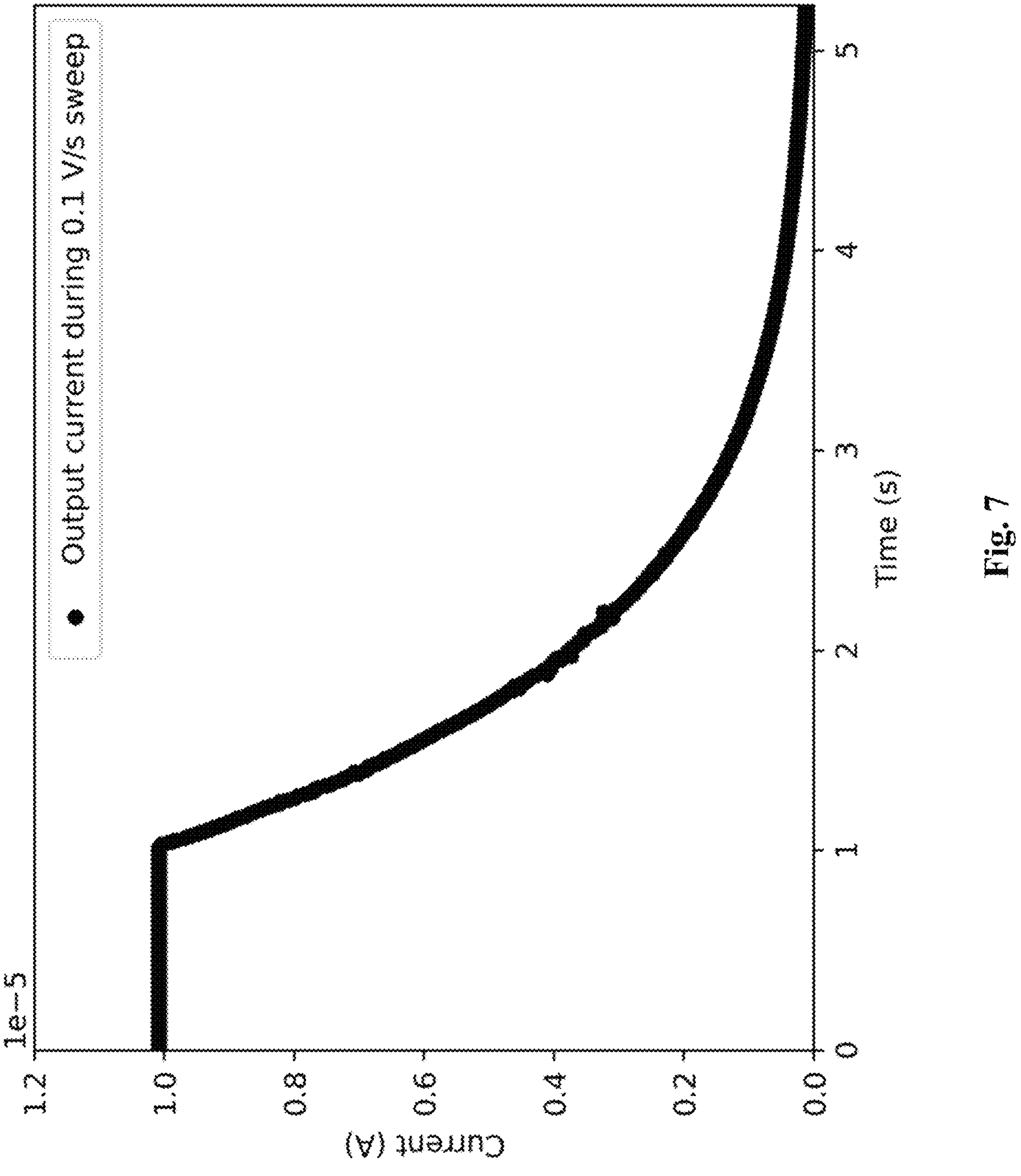
FIG. 7 provides example data representing current versus time as a battery or electrochemical device is frozen in-situ during linear sweep voltammetry. After plunge-freezing the current decays as ions in the battery are immobilized.

The sample holder may then be detached from the actuator and moved with the reservoir to a cold transfer station for loading cryo-TEM samples, such that the sample remains submerged in the cryogen from the point of plunge freezing to cryo-TEM analysis. For the example of a coin cell sample, the TEM grid working electrode can be placed in the sample device during cell assembly as illustrated in FIGS. 4-5. The process of removing the TEM grid working electrode for analysis can be accomplished a number of ways, but one example would be the modification of the coin cell casing to include a small window that can be broken while submerged in the cryogen and through which the TEM grid working electrode can be removed, as illustrated in FIG. 6.

Additionally, the described system and methods may further comprise a sample locking mechanism contained within the cryogenic liquid reservoir. The locking mechanism has jaws that snap closed on the sample as soon as it is submerged into the cryonic liquid. The jaws are made of thermally conductive metal and have been precooled by siting in the cryogenic liquid, such that when they come in contact with the sample via snapping closed, the jaws conduct heat away from the sample and freeze it more quickly than is achieved by relying on the convective cooling from the cryogenic liquid alone. This additional cooling added by the locking mechanism allows for a reduction in cooling time, and the sample freezes approximately 40-80 percent faster. The freezing rate limits the dynamic process that an be captured by the described method of in-situ freezing and temperature as only structures that evolve or relax more slowly than the freezing rate can be measured using the described technique, making freezing rate an important factor for what can be tested using the described methods. Thus, increasing the freezing rate can expand the scientific properties that can be investigated using the techniques described herein. This addition may also allow for the testing of larger samples as they can be rapidly vitrified through plunge freezing and may have applications in other fields outside of electrochemistry, such as biology.

The provided discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms “a”, “an”, and “the” include plural reference unless the context clearly dictates otherwise. Thus, for example, reference to “a cell” includes a plurality of such cells and equivalents thereof known to those skilled in the art. As well, the terms “a” (or “an”), “one or more” and “at least one” can be used interchangeably herein. It is also to be noted that the terms “comprising”, “including”, and “having” can be used interchangeably. The expression “of any of claims XX-YY” (wherein XX and YY refer to claim numbers) is intended to provide a multiple dependent claim in the alternative form, and in some embodiments is interchangeable with the expression “as in any one of claims XX-YY.”

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure. For example, when a device is set forth disclosing a range of materials, device components, and/or device configurations, the description is intended to include specific reference of each combination and/or variation corresponding to the disclosed range.

Every formulation or combination of components described or exemplified herein can be used to practice the invention, unless otherwise stated.

Whenever a range is given in the specification, for example, a density range, a number range, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter is claimed, it should be understood that compounds known and available in the art prior to Applicant’s invention, including compounds for which an enabling disclosure is provided in the references cited herein, are not intended to be included in the composition of matter claims herein.

As used herein, “comprising” is synonymous with “including,” “containing,” or “characterized by,” and is inclusive or open-ended and does not exclude additional, unrecited elements or method steps. As used herein, “consisting of” excludes any element, step, or ingredient not specified in the claim element. As used herein, “consisting essentially of” does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A method comprising:

providing a sample;

applying an electrical current or bias to the sample; and flash freezing the sample while the electrical current or bias is still being applied to the sample;

wherein the step of flash freezing is performed by submerging the sample in a cryogenic liquid.

2. The method of claim 1 further comprising analyzing the sample via cryogenic transmission electron microscopy (cryo-TEM) after the sample has been frozen.

3. The method of claim 1, wherein the sample comprises an electrochemical cell.

4. The method of claim 3, wherein the sample comprises a modified coin cell comprising a thinned TEM grid working electrode.

5. The method of claim 1, wherein the step of flash freezing is further performed by an automated plunge freezer.

6. A device comprising:

a sample holder capable of applying an electrical bias or current to a sample;

a reservoir for storing a cryogenic material; and an actuator physically connected to the sample holder for moving the sample holder from a first position, wherein the sample holder is spatially positioned outside of the reservoir to a second position, wherein the sample holder is spatially positioned inside the reservoir.

7. The device of claim 6, wherein the sample holder is a pair of tweezers or tongs, wherein the tweezers or tongs form an electrical circuit when closed.

8. The device of claim 6, further comprising a source of electrical current or bias.

9. The device of claim 8, wherein the source of electrical current or bias is a battery or electrochemical cell.

10. The device of claim 8, wherein the source off electrical current is a potentiostat, galvanostat, or other electrochemical workstation, or a wall outlet connected to a power grid.

11. The device of claim 6, wherein the device further comprises a cryogenic liquid in the reservoir.

12. The device of claim 11, wherein the cryogenic material comprises liquid or slush nitrogen, liquid ethane, liquid oxygen or the like.

13. The device of claim 6, wherein the actuator is capable of moving the sample holder from the first position to the second position in a time less than or equal to 1 s.

14. The device of claim 6, wherein the sample holder is capable of holding a sample comprising a modified coin cell comprising a TEM grid working electrode.

15. The device of claim 6, further comprising a sample receiving mechanism that is positioned in the reservoir and is capable of reducing the freezing time of the sample.

* * * * *